United States Patent [19]

Suenaga et al.

[11] Patent Number: 4,556,925
[45] Date of Patent: Dec. 3, 1985

[54] MAGNETORESISTIVE HEAD

[75] Inventors: Masahide Suenaga; Kousaku Chida; Masaki Ohura, all of Odawara, Japan

[73] Assignee: Hitachi, Ltd., Tokyo, Japan

[21] Appl. No.: 402,419

[22] Filed: Jul. 28, 1982

[30] Foreign Application Priority Data

Sep. 9, 1981 [JP] Japan ................................ 56-140974

[51] Int. Cl.[4] ................................................ G11B 5/30
[52] U.S. Cl. .................................. 360/113; 338/32 R; 324/252
[58] Field of Search ...................... 360/113; 338/32 R; 324/252

[56] References Cited

U.S. PATENT DOCUMENTS 4,052,748 10/1977 Kuijk ..................................... 360/113
4,295,173 10/1981 Romankiw et al. ................. 360/122
4,321,640 3/1982 Van Cestel .......................... 360/113
4,477,794 10/1984 Nomura et al. ..................... 360/113

Primary Examiner—John H. Wolff
Assistant Examiner—David J. Severin
Attorney, Agent, or Firm—Antonelli, Terry & Wands

[57] ABSTRACT

A magnetoresistive head comprising a magnetoresistive element, to which a magnetic bias field is applied, is disposed opposite to a magnetic recording medium moving relative thereto, and the resistance value of the magnetoresistive element varying as a result of the relative movement of the magnetoresistive element and the magnetic recording medium is detected to reproduce information recorded on the magnetic recording medium. The magnetoresistive element of the magnetic head has an elongate shape extending along the easy axis of magnetization and has protrusions at its longitudinal ends. The protrusions have, for example, a semi-circular or triangular contour. These protrusions are effective for suppressing formation of undesirable domain walls in the magnetoresistive element, so that the magnetic head can operate without substantial variation of its output voltage level and with reduced Barkhousen noise.

20 Claims, 16 Drawing Figures

MAGNETORESISTIVE HEAD

BACKGROUND OF THE INVENTION (1) Field of the Invention

This invention relates to a magnetoresistive head, and more particularly to a magnetic head of the kind described above which comprises an elongate magnetoresistive element of a magnetically anisotropic material having terminals at its ends for connection to a current source and means for supplying sense current to this magnetoresistive element for reproducing information recorded on a magnetic recording medium.

(2) Description of the Prior Art

Magnetoresistive heads utilizing the magnetoresistance effect of a thin film of a ferromagnetic material such as permalloy are now attracting attention in the field of high-density information recording by virtue of the excellent performance including the high sensitivity and the independence of the output from the moving speed of a magnetic recording medium. Such a magnetic head is known from the disclosure of, for example, U.S. Pat. No. 4,052,748.

A Barberpole magnetoresistive head, which is an example of such a magnetic head, will be described with reference to FIGS. 1 and 2. Referring to FIG. 1, the magnetoresistive head designated generally by a reference numeral 10 comprises a substrate 70 of a material such as glass, a magnetoresistive element 30 whose electrical resistance varies when a magnetic recording medium 20 moves relative thereto, and a pair of conductive terminals 40 and 50 connected to the both ends respectively of the magnetoresistive element 30. This magnetoresistive element 30 is electrically connected to a detecting circuit 60 via the conductive terminals 40 and 50, and a plurality of short bars 80 are provided on the element 30 in a relation making an angle with the element 30 and spaced apart from each other by a predetermined distance. Each of these short bars 80 is composed of a conductive strip making a preferable angle of 45° with the longitudinal axis of the magnetoresistive element 30. The magnetoresistive element 30 has generally a rectangular shape in front elevation as seen in FIG. 2a and is formed so that its major axis or longitudinal axis coincides with the easy axis of magnetization A.

A sense current supplied from the detecting circuit 60 to the magnetoresistive head 10 having the construction described flows above though the magnetoresistive element 30 in a direction orthogonal with respect to the short bars 80 to produce a magnetic bias field along substantially the longitudinal axis of the magnetoresistive element 30. Under the influence of the thus produced magnetic bias field, the magnetic recording medium 20 is moved or rotated relative to the magnetoresistive head 10, and the resultant variations of the resistance value of the magnetoresistive element 30 are detected by the detecting circuit 60. In this manner, the magnetoresistive head 10 reproduces information recorded on the magnetic recording medium 20.

However, the magnetoresistive element 30 of the prior art magnetoresistive head 10 tends to have a closure magnetic domain structure as shown in FIG. 2b after the application of the magnetic field in the direction of the hard axis of magnetization B, and, as a result, domain walls 2 extending toward the corners of the ends 30a and 30b of the magnetoresistive element 30 tend to be formed. The process of formation of such domain walls will now be explained in order.

(a) The application of the magnetic field in the direction of the hard axis of magnetization B causes inclination of the direction of magnetization having been oriented in the direction of the easy axis of magnetization A.

(b) When the application of the magnetic field is then stopped after the inclination has attained 90°, four magnetic domains having different directions of magnetization 21 appear, since the magnetization tends to circulate within the magnetoresistive element 30 before stabilization.

(c) As a result, domain walls 2 as shown in FIG. 2b are formed at the boundaries between the magnetic domains.

Thus, domain walls tend to be formed also in the end portions of the magnetoresistive element 30 of the prior art magnetoresistive head 10. Because of the fact that especially the central domain wall among those formed in the magnetoresistive element acts to cause variation of the level of the output from the magnetic head and also gives rise to generation of the Barkhousen noise, it is strongly demanded to suppress formation of such undesirable domain walls.

As a means for suppressing formation of such undesirable domain walls, a method has been proposed according to which a single-domain structure is obtained by externally applying a magnetic bias field in the direction of the easy axis of magnetization of the magnetoresistive element.

However, the proposed method is not applicable to a magnetic head designed for the reproduction of information recorded in a high recording density on a magnetic recording medium. This is because, in such a magnetic head designed for the reproduction of high-density recorded information, shielding films are formed on both sides of the magnetoresistive element while defining a narrow gap therebetween, and, due to the absorption of the magnetic flux by the shielding films, the magnetoresistive element is not effectively energized.

On the other hand, in a Barberpole magnetoresistive head as disclosed in the above-mentioned U.S. Pat. No. 4,052,748, it is theoretically possible to suppress formation of undesirable domain walls by increasing the value of a sense current supplied to the magnetoresistive element thereby increasing the strength of the magnetic bias field applied in the direction of the easy axis of magnetization. Actually, however, when the current density of the detecting current supplied to the magnetoresistive element exceeds an allowable limit which is, for example, $5 \times 10^6$ A/cm$^2$ when the magnetoresistive element is in the form of a thin film of permalloy, the magnetoresistive element is liable to be destroyed by being heated by the excessive Joule heat and also due to the electromigration, and it has thus been impossible to completely suppress formation of undesirable domain walls in the magnetoresistive element of the prior art magnetoresistive head.

SUMMARY OF THE INVENTION

It is a primary object of the present invention to provide an improved magnetoresistive head in which formation of undesirable domain walls in its magnetoresistive element can be satisfactorily suppressed, and the output voltage level variation as well as the Barkhousen noise can be greatly reduced.

The present invention which attains the above object is featured by the fact that, in a magnetoresistive head comprising an elongate magnetoresistive element of a magnetically anisotropic material and means for supplying a sense current to the magnetoresistive element in a direction making a predetermined angle with the easy axis of magnetization of the magnetoresistive element thereby reproducing information recorded on a magnetic recording medium, the major axis to the magnetoresistive element coincides with the easy axis of magnetization, and the both ends in the longitudinal direction of the magnetoresistive element are extended along the direction of the easy axis of magnetization to provide protrusions.

In the magnetoresistive head of the present invention above described, the protrusions have either an arcuate contour or a triangular contour.

DESCRIPTION OF THE PREFERRED EMBODIMENTS

A preferred embodiment of the magnetoresistive head according to the present invention will now be described in detail with reference to FIG. 5.

Figure 5:
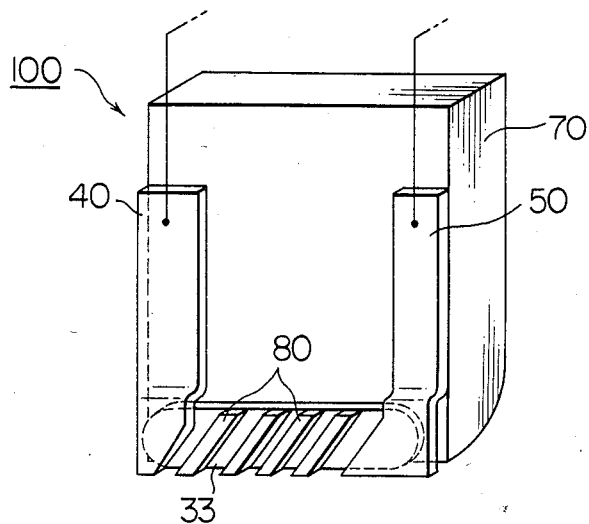
FIG. 5 is a schematic perspective view of a preferred embodiment of the magnetoresistive head according to the present invention.

Referring to FIG. 5, the magnetoresistive head embodying the present invention is generally designated by the reference numeral 100 and comprises a substrate 70 of glass or like material, a magnetoresistive element 33 of a magnetically anisotropic material extending along the lower end of the substrate 70, this magnetoresistive element 33 having its longitudinal direction coinciding with the easy axis of magnetization and having its longitudinal both ends protruded along the easy axis of magnetization, a pair of conductive terminals 40 and 50 connected to the both ends of the magnetoresistive element 33, and a plurality of short bars 80 provided on the magnetoresistive element 33 in a relation each makin an angle of 45° with the longitudinal axis of the element 33 and spaced apart from each other by a predetermined distance.

The conductive terminals 40, 50 and the short bars 80 are formed by vapor-depositing gold in strips by the vacuum evaporation technique. The material of the magnetoresistive element 33 is 81 Ni-19 Fe permalloy, and the element 33 having a film thickness of 300 Å is formed on the substrate 70 by the thin film technique.

Figure 6A:
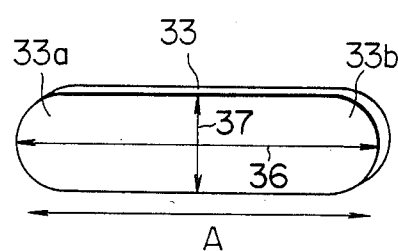
FIGS. 6a and 6b show the shape of the magnetoresistive element in the magnetoresistive head shown in FIG. 5, and a domain wall tending to be formed in the magnetoresistive element, respectively.

As shown in FIG. 6a, the major axis 36 and minor axis 37 of this magnetoresistive element 33 are 50 $\mu$m and 10 $\mu$m long respectively, and the direction of the major axis 36 coincides with that of the easy axis of magnetization A. Further, this magnetoresistive element 33 is so shaped that its both end portions 33a and 33b in the direction of the major axis 36 have a semicircular contour. The magnetoresistive element 33 having such a shape proved to be optimum according to the results of an experiment conducted by the inventors. In the experiment conducted by the inventors for the purpose of suppressing formation of domain walls, the shape of the magnetoresistive element was classified into a first group having concave end portions as shown in FIGS. 3a, 3b and 4a, 4b and a second group having convex end portions as shown in FIGS. 6a, 6b and 7a, 7b.

Figure 1:
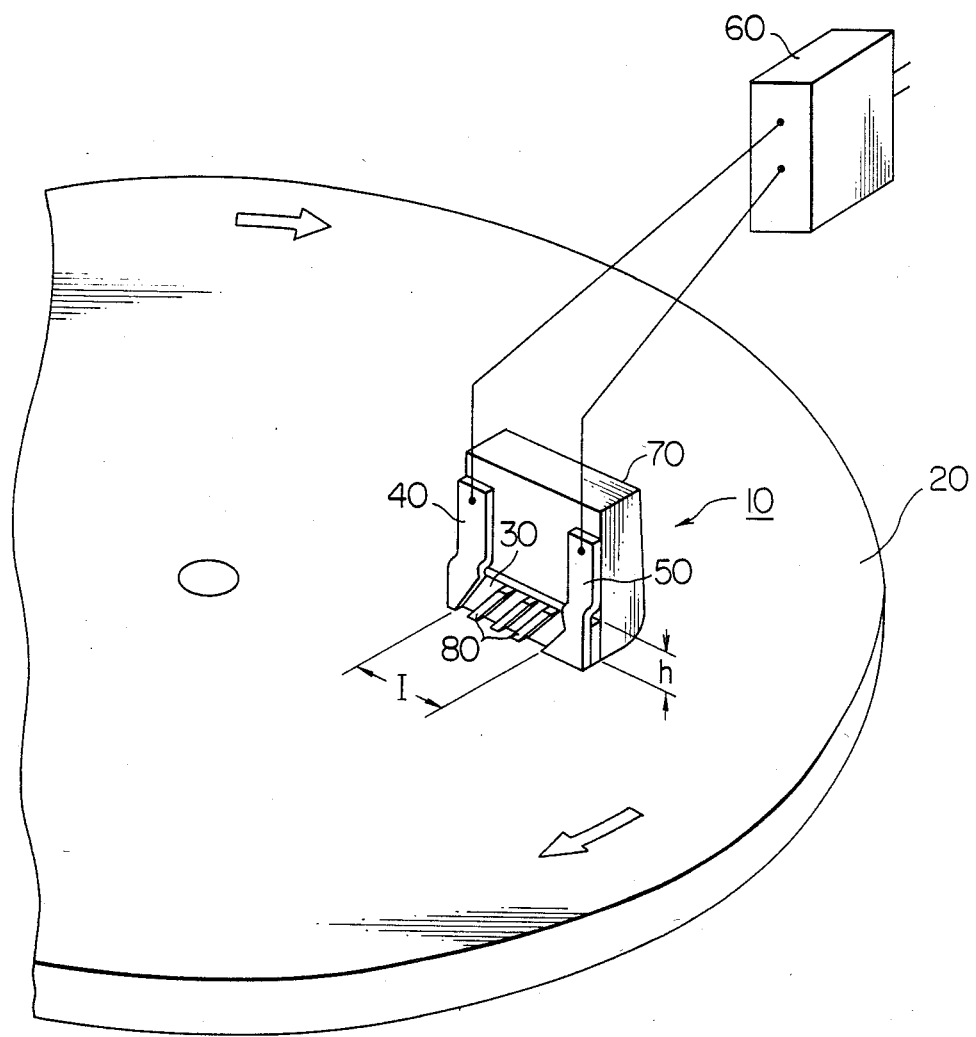
FIG. 1 is a schematic perspective view generally showing a Barberpole magnetoresistive head and a magnetic recording medium.
Figure 2A:
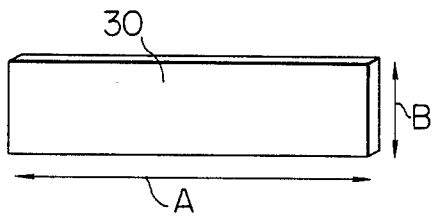
FIGS. 2a and 2b show the shape of the magnetoresistive element in the prior art magnetoresistive head and domain walls tending to be formed in the magnetoresistive element, respectively.
Figure 2B:
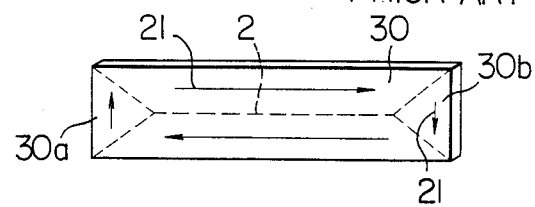
Figure 3A:
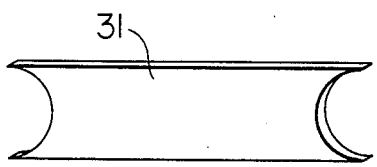
FIGS. 3a, 3b and FIGS. 4a, 4b show the shape of magnetoresistive elements fabricated for the purpose of suppressing formation of domain walls but proved to be not so effective, and domain walls tending to be formed in such magnetoresistive elements, respectively.
Figure 3B:
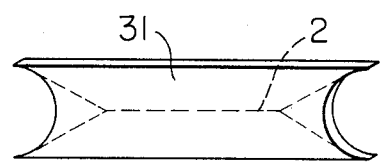
Figure 4A:
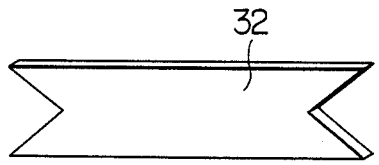
Figure 4B:
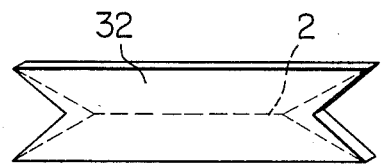
Figure 9:
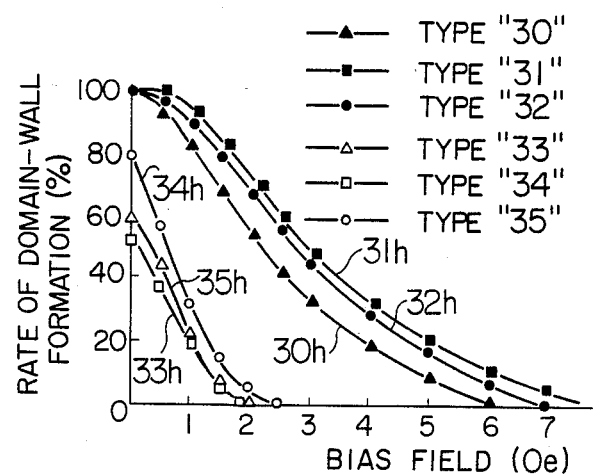
FIG. 9 is a graph showing the relation between the rate of domain wall formation and the strength of magnetic bias field applied in the direction of the easy axis of magnetization to illustrate how the rate of domain wall formation is dependent upon the shape of the magnetoresistive element.

A magnetoresistive element 31 shown in FIG. 3a has arcuate concavities at the longitudinal ends thereof respectively, and another magnetoresistive element 32 shown in FIG. 4a has triangular concavities at the longitudinal ends thereof respectively. When a magnetic field was applied to the magnetoresistive elements 31 and 32 shown in FIGS. 3a and 4a in the direction of the hard axis of magnetization B, domain walls 2 extending toward the corners of the ends were observed as shown in FIGS. 3b and 4b respectively. FIG. 9 shows the relation between the rate of domain wall formation and the strength of the magnetic bias field applied to various magnetoresistive elements in the direction of the easy axis of magnetization A, after an alternating magnetic field having a strength of 100 Oe was applied in the direction of the hard axis of magnetization B. The curves 31h and 32h in FIG. 9 represent the results of observation on the magnetoresistive elements 31 and 32 respectively. It will be apparent from reference to these curves 31h and 32h that formation of domain walls cannot be suppressed unless the strength of the magnetic bias field is selected to be more than 7 Oe. However, application of a magnetic bias field having such a large strength is difficult as a matter of fact, and it is the inventors' conclusion that the magnetoresistive elements 31 and 32 having concavities at the longitudinal ends are not suitable for attaining the desired object.

Figure 6B:
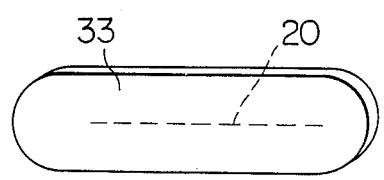
Figure 7A:
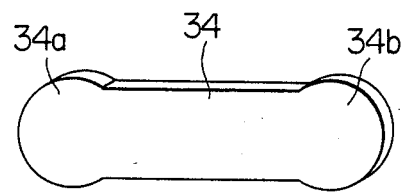
FIGS. 7a and 7b show the shape of another form of the magnetoresistive element of the present invention, and a domain wall tending to be formed in the magnetoresistive element, respectively.
Figure 7B:
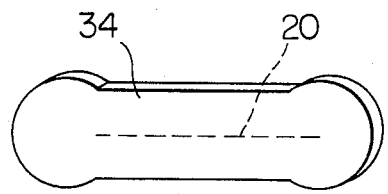
Figure 8A:
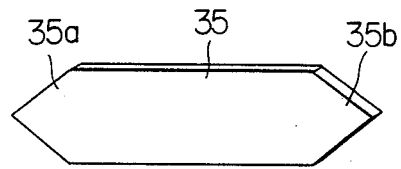
FIGS. 8a and 8b show the shape of still another form of the magnetoresistive element of the present invention, and a domain wall tending to be formed in the magnetoresistive element, respectively.
Figure 8B:
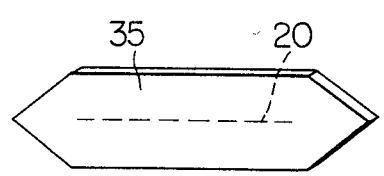

On the other hand, the magnetoresistive element 33 shown in FIG. 6a has semicircular convexities or protrusions at the longitudinal ends thereof respectively. A magnetoresistive element 34 shown in FIG. 7a has semicircular convexities or protrusions at the longitudinal ends thereof respectively, and the diameter of the semicircle is longer than the length of the minor axis of the element 34. Another magnetoresistive element 35 shown in FIG. 7a has triangular convexties or protrusions at the longitudinal ends thereof respectively. The curves 33h, 34h and 35h in FIG. 9 represent similarly the results of observation on the magnetoresistive elements 33, 34 and 35 respectively after the alternating magnetic field was applied in the direction of the hard axis of magnetization B. The inventors discovered that, in the case of the curves 33h to 35h, the percentage of domain wall formation drops to about 50% to 80% even in the absence of the magnetic bias field. Further, in the case of these magnetoresistive elements 33 to 35 having the protrusions at the longitudinal ends thereof, a domain wall 20, even if it might be formed, was linear and had a short length as seen in FIGS. 6b, 7b and 8b, and application of a magnetic bias field having a strength of the order of 2 Oe could substantially suppress formation of such a domain wall.

Therefore, in the magnetoresistive head 100 embodying the present invention, application of a magnetic bias field of slight strength e.g. less than 3 Oe as shown in FIG. 9, could substantially prevent formation of domain walls in the magnetoresistive element. Consequently, the output voltage level variation could be reduced to about 1/5 of the prior art value, and the Barkhousen noise assumed to be attributable to migration of domain walls could hardly generate.

Figure 10:
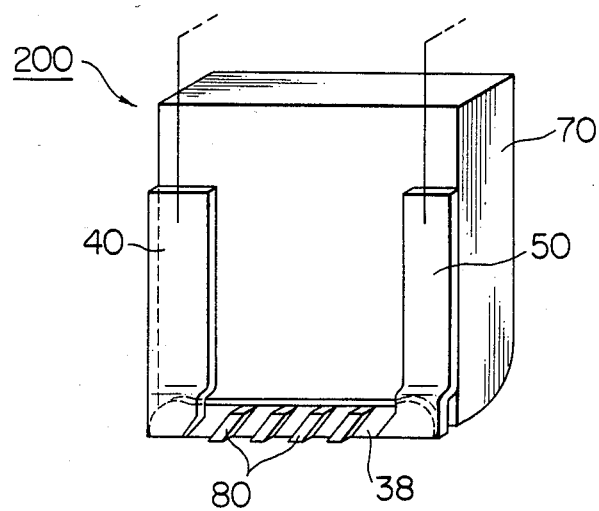
FIG. 10 is a schematic perspective view of another preferred embodiment of the magnetic head according to the present invention.

Another embodiment of the magnetoresistive head according to the present invention will now be described with reference to FIG. 10.

The magnetic head embodying another aspect of the present invention is generally designated by the reference numeral 200 and comprises a substrate 70 of glass or like material, a magnetoresistive element 38 of a magnetically anisotropic material and a pair of conductive terminals 40 and 50 mounted on the substrate 70, and a plurality of parallel short bars 80 provided on the magnetoresistive element 38 in a relation making an angle of 45° with the longitudinal axis of the element 38 and spaced apart from each other by a predetermined distance. The magnetoresistive element 38 in this second embodiment has such a shape that the lower part of the element 34 shown in FIG. 7a, 7b is removed by grinding to leave a flat lower surface, so that the both ends of the element 38 have a quadrant contour having a radius longer than the length of the minor axis of the element 38.

In the magnetic head 200 having the illustrated construction too, the provision of the protrusions at the longitudinal ends of the magnetoresistive element 38 is effective for suppressing formation of undesirable domain walls thereby preventing variation of the output voltage level and reducing the Barkhousen noise.

The present invention is in no way limited to its application to a Barberpole magnetoresistive head as described hereinbefore, and it is apparent that the present invention is equally effectively applicable to any other magnetoresistive heads adapted to operate under application of a magnetic bias field, for example, a permanent-magnet-biased magnetoresistive head.

It will be understood from the foregoing detailed description that, in the magnetoresistive head according to the present invention, its magnetoresistive element has protrusions protruding from the both ends thereof in the longitudinal direction (the direction of the easy axis of magnetization) to suppress formation of undesirable domain walls thereby preventing variation of the output voltage level and reducing the Barkhousen noise.

We claim:

1. A magnetoresistive head for reproducing information recorded on a magnetic recording medium by movement to the recording medium comprising:
    an elongate magnetoresistive element of a magnetically anisotropic material disposed opposite to said recording medium and having protrusions provided by extending the both ends thereof along a longitudinal axis coinciding with the easy axis of magnetization of said magnetically anisotropic material so that said magnetoresistive element has a non-rectangular configuration;
    magnetic bias field applying means for applying a magnetic bias field to said magnetoresistive element in a predetermined direction;
    conductive terminals connected to opposite ends of said magnetoresistive element in said longitudinal axis, for electrically connecting said magnetoresistive element to an external circuit; and
    a substrate mounting said magnetoresistive element, said conductive terminals and said magnetic bias field applying means thereon.

2. A magnetoresistive head according to claim 1, wherein said magnetic bias field applying means includes a plurality of parallel short bars arranged to make a predetermined angle with the easy axis of magnetization of said magnetoresistive element so as to generate the magnetic bias field when a current is supplied thereto.

3. A magnetoresistive head according to claim 1, wherein said magnetic bias field applying means includes a permanent magnet for biasing said magnetoresistive element.

4. A magnetoresistive head according to claim 1, wherein said magnetic bias field applying means applies a magnetic bias field to said magnetoresistive element of less than 3 Oe.

5. A magnetoresistive head comprising an elongate magnetoresistive element of a magnetically anisotropic material which at its both ends has conductive terminals for connection to a current source and means for forcing the current to flow through said magnetoresistive element at a predetermined angle with an easy axis of magnetization of said element thereby applying a magnetic bias field to said magnetoresistive element, wherein said magnetoresistive element has a longitudinal axis which coincides with the easy axis of magnetization thereof, and the longitudinal ends of said magnetoresistive element are extended along the easy axis of magnetization to provide protrusions so that said magnetoresistive element has a non-rectangular configuration.

6. A magnetoresistive head according to claim 1 or 5, wherein said protrusions of said magnetoresistive element have an arcuate contour.

7. A magnetoresistive head according to claim 1 or 5, wherein each of said protrusions of said magnetoresistive element has a triangular contour having an angle outwardly protruding along the easy axis of magnetization as one of the vertices of the triangle.

8. A magnetoresistive head according to claim 1 or 5, wherein said protrusions of said magnetoresistive element have a quadrant contour.

9. A magnetoresistive head according to claim 5, wherein said means for forcing the current to flow through said magnetoresistive element applies a magnetic bias field to said magnetoresistive element of less than 3 Oe.

10. A magnetoresistive head for reproducing information recorded on a magnetic recording medium by movement relative to the recording medium comprising:
   an elongate magnetoresistive element of a magnetically anisotropic material disposed opposite to said recording medium, said magnetoresistive element including means in the form of a main body portion and means in the form of two end portions respectively disposed along the longitudinal axis of the main body portion, said means in the form of the end portions being configured for suppressing the formation of undesirable domain walls in said magnetoresistive element;
   magnetic bias field applying means for applying a magnetic bias field to said magnetoresistive element in a predetermined direction;
   a conductive terminals connected to opposite ends of said magnetoresistive element in said longitudinal axis, for electrically connecting said magnetoresistive element through an external circuit; and
   a substrate mounting said magnetoresistive element, said conductive terminals and said magnetic bias applying means thereon.

11. A magnetoresistive head according to claim 10 wherein said magnetic bias field applying means applies a magnetic bias field of less than 3 Oe.

12. A magnetoresistive head according to claim 11, wherein said magnetic bias field applying means includes a plurality of parallel short bars arranged to make a predetermined angle with the easy axis of magnetization of said magnetoresistive element so as to generate the magnetic bais field when a current is supplied thereto.

13. A magnetoresistive head according to claim 11, wherein said magnetic bias field applying means includes a permanent magnet for biasing said magnetoresistive element.

14. A magnetoresistive head according to claim 10, wherein said two end portions of said magnetoresistive element have a non-rectangular configuration.

15. A magnetoresistive head according to claim 14, wherein said main body portion has a substantially rectangular configuration.

16. A magnetoresistive head according to claim 14 wherein the longitudinal axis of said magnetoresistive element coincides with the easy axis of magnetization of said magnetically anisotropic material, said end portions adjoining said main body portion having an outer contour with protrusions extending in opposite directions outwardly from the main body portion along the longitudinal axis.

17. A magnetoresistive head according to claim 16, wherein said protrusions have an arcuate contour.

18. A magnetoresistive head according to claim 16, wherein said two end portions have a triangular configuration with said protrusions being formed as an angle outwardly protruding along the easy axis of magnetization as one of the vertices of the triangle.

19. A magnetoresistive head according to claim 16, wherein said protrusions have a quadrant contour.

20. A magnetoresistive head according to claim 16, wherein said magnetic bias field applying means applies a magnetic bias field to said magnetoresistive element of less than 3 Oe.

* * * * *